(12) United States Patent
Urakawa et al.

(10) Patent No.: US 10,135,450 B1
(45) Date of Patent: Nov. 20, 2018

(54) CHARGE PUMP CIRCUIT AND PLL CIRCUIT

(71) Applicants: Kabushiki Kaisha Toshiba, Minato-ku, Tokyo (JP); Toshiba Electronic Devices & Storage Corporation, Minato-ku, Tokyo (JP)

(72) Inventors: Go Urakawa, Kanagawa (JP); Tsuneo Suzuki, Kanagawa (JP)

(73) Assignees: Kabushiki Kaisha Toshiba, Tokyo (JP); Toshiba Electronic De4vices & Storage Corporation, Tokyo (JP)

( * ) Notice: Subject to any disclaimer, the term of this patent is extended or adjusted under 35 U.S.C. 154(b) by 0 days.

(21) Appl. No.: 15/903,073

(22) Filed: Feb. 23, 2018

(30) Foreign Application Priority Data

Sep. 19, 2017 (JP) ................................. 2017-179345

(51) Int. Cl.
*H03L 7/089* (2006.01)
*H03L 7/093* (2006.01)

(52) U.S. Cl.
CPC ............ *H03L 7/093* (2013.01); *H03L 7/0891* (2013.01); *H03L 7/0895* (2013.01)

(58) Field of Classification Search
CPC ..... H03L 7/089; H03L 7/0891; H03L 7/0895; H03L 7/093
See application file for complete search history.

(56) References Cited

U.S. PATENT DOCUMENTS

| 6,229,362 B1* | 5/2001 | Choi ..................... H03L 7/0898 327/157 |
| 8,018,269 B2* | 9/2011 | Wang ..................... H03L 7/0896 327/536 |
| 9,680,483 B2* | 6/2017 | Tsunoda ................ H03L 7/0895 |

FOREIGN PATENT DOCUMENTS

| EP | 0940921 A2 | 9/1999 |
| JP | 2984682 B2 | 11/1999 |
| JP | 2001-111419 A | 4/2001 |

* cited by examiner

*Primary Examiner* — Patrick O'Neill
(74) *Attorney, Agent, or Firm* — White & Case LLP

(57) ABSTRACT

A charge pump circuit of an embodiment includes a current mirror circuit, a first drive switch, a capacitor and a switch circuit. The current mirror circuit causes a current obtained by mirroring a reference current to flow to a first output terminal and a second output terminal. The first drive switch connects or disconnects the first output terminal and a charge pump output terminal. The switch circuit connects the capacitor either to a discharge path between the second output terminal and a node which provides a predetermined voltage or to a charge path between the charge pump output terminal and a GND.

10 Claims, 8 Drawing Sheets

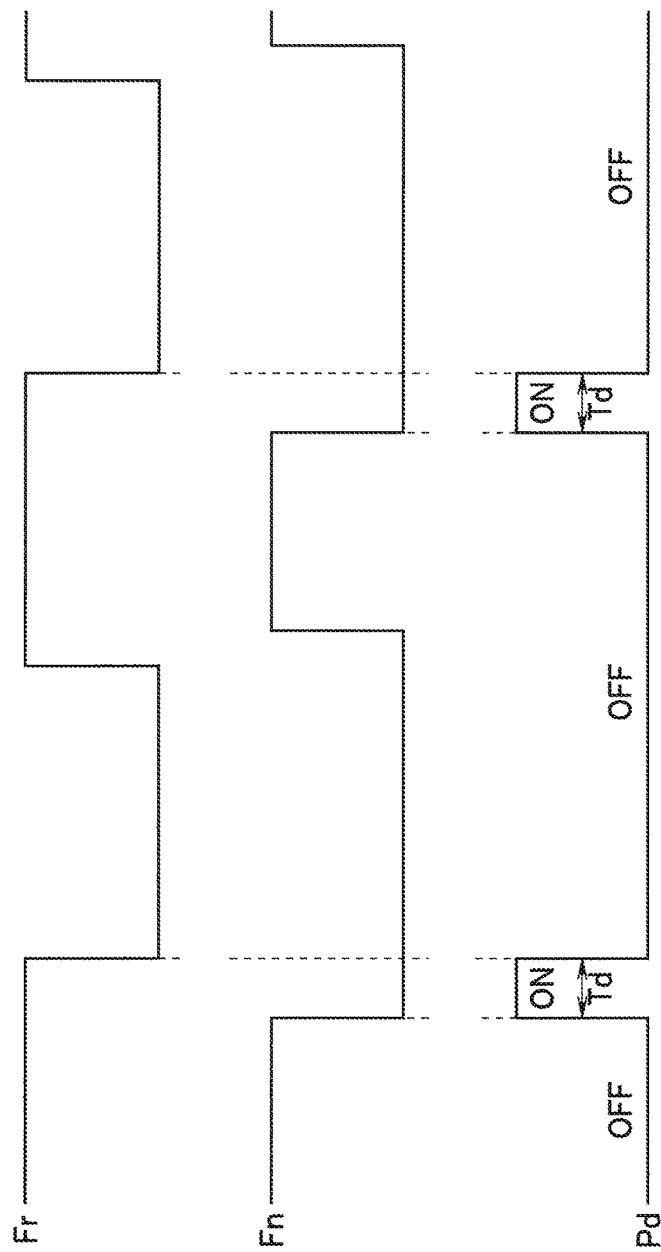

US 10,135,450 B1

CHARGE PUMP CIRCUIT AND PLL CIRCUIT

CROSS-REFERENCE TO RELATED APPLICATION

This application is based upon and claims the benefit of priority from the Japanese Patent Application No. 2017-179345 filed on Sep. 19, 2017, the entire contents of which are incorporated herein by reference.

FIELD

An embodiment described herein relates generally to a charge pump circuit and a PLL circuit.

BACKGROUND

Conventionally, there has been a PLL circuit in which a phase comparator, a charge pump circuit, a loop filter and a VCO are provided, and which outputs an output signal synchronized with a phase of an input frequency signal.

In the PLL circuit, particularly in the charge pump circuit, there is a case where noise such as flicker noise and thermal noise is superimposed on an output signal.

For example, the charge pump circuit includes a current mirror circuit, and there is a case where noise generated at a mirror source is superimposed on a current at a mirror destination in accordance with a mirror ratio. If a size of a mirror source transistor is made larger, a current flowing in the mirror source transistor is increased, and a mirror ratio is decreased, it is possible to suppress noise at the current mirror circuit.

While it is possible to suppress noise by making a size of the charge pump circuit larger, there is a problem that it is difficult to make the size smaller while trying to suppress noise.

BRIEF DESCRIPTION OF THE DRAWINGS

FIG. 4A is a waveform diagram illustrating a waveform of the reference clock signal Fr of the PLL circuit according to the embodiment;

FIG. 4B is a waveform diagram illustrating a waveform of the frequency division signal Fn of the PLL circuit according to the embodiment;

FIG. 4C is a waveform diagram illustrating a waveform of a phase difference signal Pd of the PLL circuit according to the embodiment;

DETAILED DESCRIPTION

Embodiment

A charge pump circuit of an embodiment includes a current mirror circuit, a first drive switch, a capacitor and a switch circuit. The current mirror circuit causes a current obtained by mirroring a reference current to flow to a first output terminal and a second output terminal. The first drive switch connects or disconnects the first output terminal and a charge pump output terminal. The switch circuit connects the capacitor either to a discharge path between the second output terminal and a node which provides a predetermined voltage or to a charge path between the charge pump output terminal and a GND.

The embodiment will be described below with reference to the drawings.

(Configuration)

Figure 1:
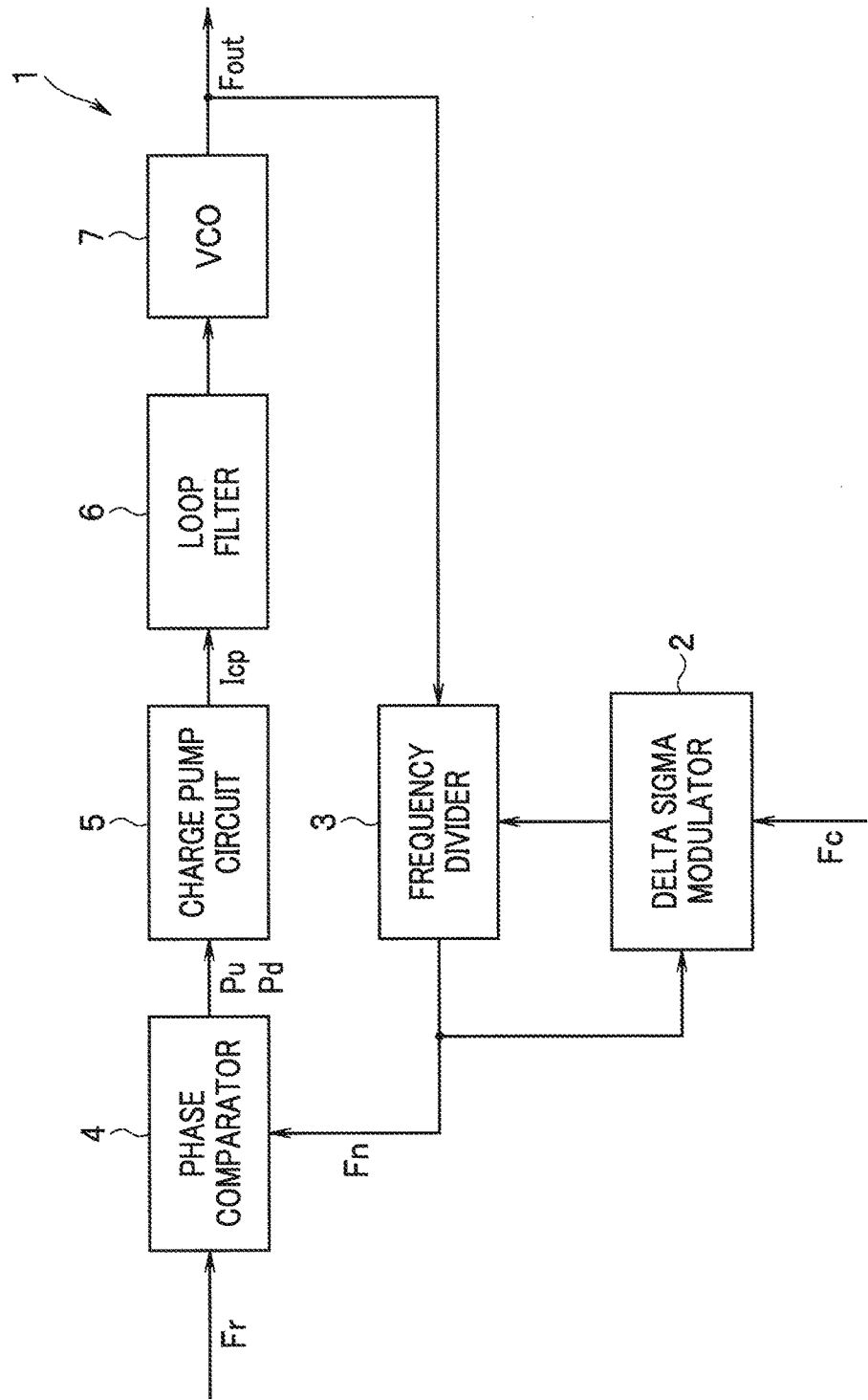
FIG. 1 is a block diagram illustrating an example of a configuration of a PLL circuit according to an embodiment.

FIG. 1 is a block diagram illustrating an example of a configuration of a PLL circuit (phase locked loop circuit) 1 according to the embodiment.

The PLL circuit 1 includes a delta sigma modulator 2, a frequency divider 3, a phase comparator 4, a charge pump circuit 5, a loop filter 6 and a VCO (voltage controlled oscillator) 7.

The delta sigma modulator 2 is connected to an external frequency control apparatus which is not illustrated and the frequency divider 3. The delta sigma modulator 2 performs delta sigma modulation to generate a frequency division control signal on the basis of a frequency control signal Fc input from the frequency control apparatus and a frequency division signal Fn returned from the frequency divider 3 and outputs the frequency division control signal to the frequency divider 3.

The frequency divider 3 is connected to the VCO 7 and the phase comparator 4. The frequency divider 3 divides a frequency of a VCO output signal Fout returned from the VCO 7 on the basis of the frequency division control signal input from the delta sigma modulator 2 and outputs the frequency division signal Fn to the phase comparator 4.

The phase comparator 4 is connected to an external clock generator which is not illustrated and the charge pump circuit 5. The phase comparator 4 compares phases to generate phase difference signals Pu and Pd in accordance with a phase difference on the basis of the frequency division signal Fn input from the frequency divider 3 and a reference clock signal Fr having a predetermined frequency, input from the clock generator and outputs the phase difference signals Pu and Pd to the charge pump circuit 5.

The charge pump circuit 5 is connected to the loop filter 6. The charge pump circuit 5 outputs an output current in accordance with the phase difference signals Pu and Pd to the loop filter 6 on the basis of the phase difference signals Pu and Pd input from the phase comparator 4.

Here, if linearity of the output current with respect to the phase difference signals Pu and Pd is unfavorable, high frequency noise of the delta sigma modulator 2 is converted into a low frequency due to distortion, and noise shaping characteristics of the delta sigma modulator 2 deteriorate. If the output current is increased to improve linearity, noise and spurious of a clock also increase in proportion to the output current.

The loop filter 6 is connected to the VCO 7. The loop filter 6 smooths the output current input from the charge pump circuit 5 to generate a loop filter output signal and outputs the loop filter output signal to the VCO 7.

The VCO 7 generates a VCO output signal Fout having a frequency in accordance with a voltage of the loop filter output signal input from the loop filter 6 and outputs the VCO output signal Fout to outside.

Subsequently, the charge pump circuit 5 according to the embodiment will be described.

Figure 2:
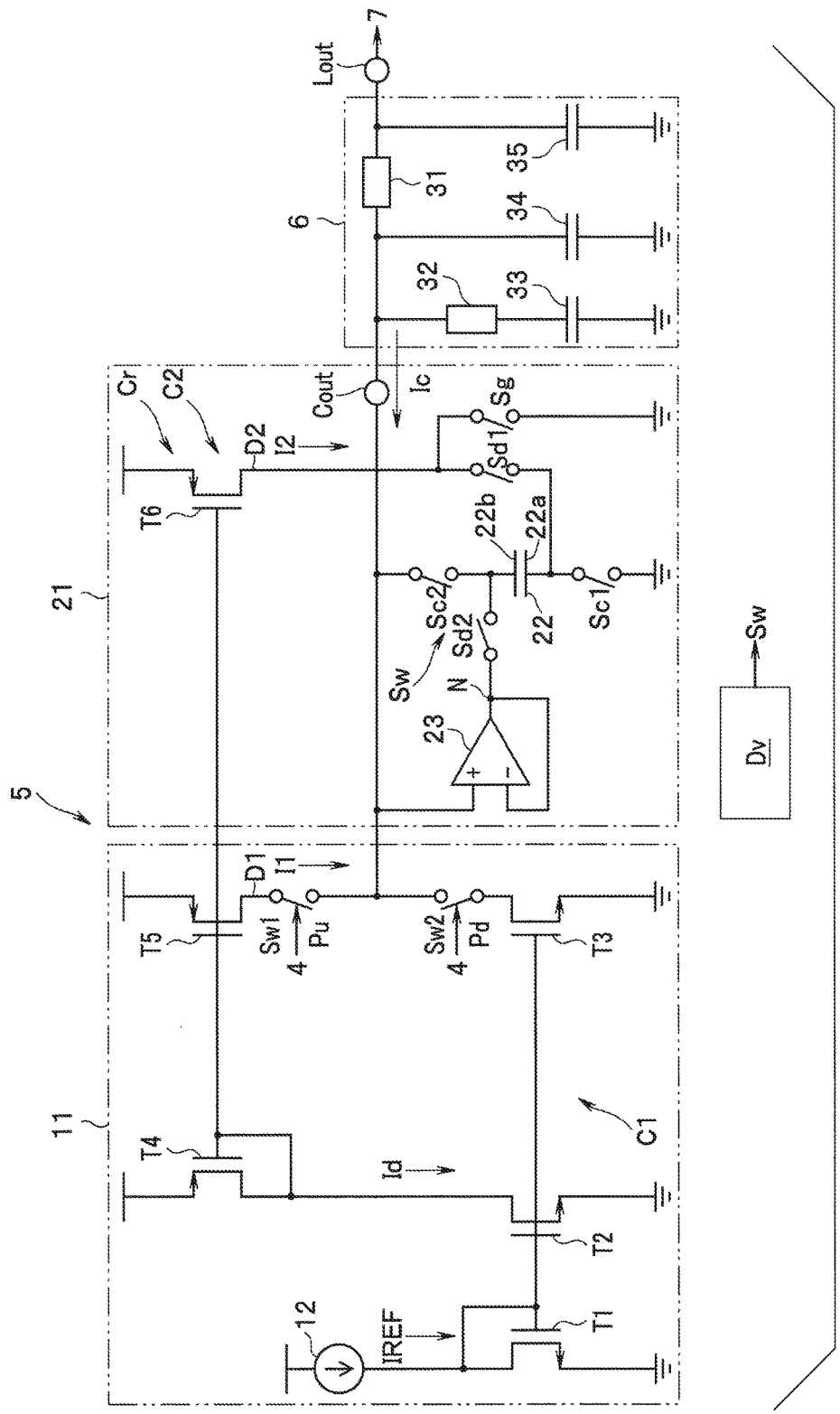
FIG. 2 is a circuit diagram illustrating an example of a charge pump circuit and a loop filter of the PLL circuit according to the embodiment.

FIG. 2 is a circuit diagram illustrating an example of the charge pump circuit 5 and the loop filter 6 of the PLL circuit 1 according to the embodiment.

The charge pump circuit 5 includes a main charge pump 11 and a sub charge pump 21. The main charge pump 11, an output current of which increases in accordance with the output current of the sub charge pump 21, operates in a state where linearity is favorable.

The main charge pump 11 includes a constant current source 12, a transistor T1 which is a first transistor, a transistor T2 which is a second transistor, a transistor T3 which is a third transistor, a transistor T4 which is a fourth transistor, a transistor T5 which is a fifth transistor, a drive switch Sw1 which is a first drive switch, and a drive switch Sw2 which is a second drive switch. The transistors T1, T2 and T3 are configured with, for example, an NMOS. The transistors T4 and T5 are configured with, for example, a PMOS.

The constant current source 12 has one end connected to a power supply and the other end connected to the transistor T1. The constant current source 12 outputs a reference current Iref to the transistor T1.

The transistor T1 has a drain connected to the constant current source 12, a source connected to a GND, and a gate connected to the transistors T2 and T3. The drain and the gate of the transistor T1 are connected to each other.

The transistor T2 has a drain connected to a drain of the transistor T4 and a source connected to the GND.

The transistor T3 has a drain connected to the drive switch Sw2 and a source connected to the GND.

The transistors T1, T2 and T3 constitute a current mirror C1 which is a first current mirror.

The transistor T4 has a source connected to the power supply and a gate connected to the transistors T5 and T6. A drain and the gate of the transistor T4 are connected to each other.

The transistor T5 has a source connected to the power supply and a drain connected to the drive switch Sw1. The drain of the transistor T5 constitutes an output terminal D1 which is a first output terminal.

The drive switches Sw1 and Sw2 are connected between the transistors T3 and T5 in series. Between the drive switches Sw1 and Sw2, a charge pump output terminal Cout is connected. The drive switches Sw1 and Sw2 are configured with a semiconductor switch and is driven by the phase difference signals Pu and Pd input from the phase comparator 4.

The drive switch Sw1 has one end connected to a drain of the transistor T5 and the other end connected to the charge pump output terminal Cout. The drive switch Sw1 connects or disconnects the output terminal D1 and the charge pump output terminal Cout in accordance with the phase difference signal Pu.

The drive switch Sw2 has one end connected to the drain of the transistor T3 and the other end connected to the charge pump output terminal Cout. The drive switch Sw2 connects or disconnects the GND and the charge pump output terminal Cout via the transistor T3 in accordance with the phase difference signal Pd.

The sub charge pump 21 includes a transistor T6 which is a sixth transistor, a capacitor 22, an amplifier 23, a switch circuit Sw, a driver Dv and the charge pump output terminal Cout.

The transistor T6 has a source connected to the power supply and a drain connected to the switch circuit Sw. The drain of the transistor T6 constitutes an output terminal D2 which is a second output terminal.

The transistors T4, T5 and T6 constitute a current mirror C2 which is a second current mirror.

That is, the current mirrors C1 and C2 constitute a current mirror circuit Cr. The current mirrors C1 and C2 are connected to each other. The current mirror C1 is configured with an NMOS, and connected to the constant current source 12. The current mirror C2 is configured with a PMOS and includes output terminals D1 and D2.

Further, the current mirror circuit Cr causes currents I1 and I2 obtained by mirroring the reference current Iref of the constant current source 12 to flow to the output terminals D1 and D2.

Further, the current mirror C1 includes the transistors T1, T2 and T3, gates of which are connected to one another, the drain of the transistor T1 is connected to the gate and the constant current source 12, respective drains of the transistor T2 and the transistor T4 are connected to each other, and the transistor T3 has a source connected to the GND and a drain connected to the drive switch Sw2.

Further, the current mirror C2 includes the transistors T4, T5 and T6, gates of which are connected to one another, the transistor T5 includes the output terminal D1, and the transistor T6 includes the output terminal D2.

The capacitor 22, which is connected to the switch circuit Sw, discharges electric charges by a current I2 input from the output terminal D2 and charges electric charges by a charge current Ic input from the loop filter 6.

The amplifier 23, in which an inverted input terminal and an amplifier output terminal are connected to each other, has a non-inverted input terminal connected to the charge pump output terminal Cout and the amplifier output terminal connected to a node N. The amplifier 23 constitutes a voltage follower circuit.

The switch circuit Sw connects the capacitor 22 either to a discharge path between the output terminal D2 and the node N which provides a predetermined voltage or to a charge path between the charge pump output terminal Cout and the GND. The switch circuit Sw is configured with a semiconductor switch and is driven by the driver Dv. The switch circuit Sw includes discharge switches Sd1 and Sd2, charge switches Sd1 and Sc2 and a ground switch Sg.

The discharge switch Sd1 is provided between a first end 22a of the capacitor 22 and the output terminal D2. The discharge switch Sd2 is provided between a second end 22b of the capacitor 22 and the node N. The discharge switches Sd1 and Sd2 connect or disconnect the first end 22a and the output terminal D2, and the second end 22b and the node N.

The charge switch Sc1 is provided between the first end 22a and the GND. The charge switch Sc2 is provided between the second end 22b and the charge pump output terminal Cout. The charge switches Sc1 and Sc2 connect or disconnect the first end 22a and the GND, and the second end 22b and the charge pump output terminal Cout.

When the discharge switches Sd1 and Sd2 are put into a connection state, and the charge switches Sc1 and Sc2 are put into a disconnection state, the capacitor 22 is connected to the discharge path. When the discharge switches Sd1 and Sd2 are put into a disconnection state and the charge switches Sc1 and Sc2 are put into a connection state, the capacitor 22 is connected to the charge path.

The ground switch Sg, which is provided between the output terminal D2 and the GND, connects or disconnects the output terminal D2 and the GND.

The driver Dv drives the switch circuit Sw. Specifically, the driver Dv outputs drive signals to the discharge switches Sd1 and Sd2, the charge switches Sc1 and Sc2, and the ground switch Sg in accordance with predetermined order, and switches a state of each of the discharge switches Sd1 and Sd2, the charge switches Sc1 and Sc2 and the ground switch Sg to either an ON state or an OFF state.

The charge pump output terminal Cout, which is connected between the other end of the drive switch Sw1 and one end of the drive switch Sw2, outputs an output current to the loop filter 6.

The loop filter 6 includes resistances 31 and 32, capacitors 33, 34 and 35 and a loop filter output terminal Lout.

The resistance 31 has one end connected to the charge pump output terminal Cout and the other end connected to the loop filter output terminal Lout.

The loop filter output terminal Lout is connected to the other end of the resistance 31.

The resistance 32 has one end connected to the charge pump output terminal Cout and the resistance 31 and the other end connected to the capacitor 33.

The capacitor 33 has one end connected to the resistance 32 and the other end connected to the GND.

The capacitor 34 has one end connected to the charge pump output terminal Cout and the resistance 31 and the other end connected to the GND.

The capacitor 35 has one end connected to the loop filter output terminal Lout and the resistance 31 and the other end connected to the GND.

The capacitors 33, 34 and 35 charge electric charges when a current I1 is output from the charge pump circuit 5, and discharge electric charges when a charge current Ic is led by the charge pump circuit 5.

(Operation)

Operation of the charge pump circuit 5 according to the present embodiment will be described.

At the charge pump circuit 5, each cycle of a phase difference output cycle, a discharge cycle and a charge cycle is repeatedly performed in accordance with a predetermined period.

When the charge current Ic is input from the loop filter 6 to the charge pump circuit 5, a voltage of the loop filter output signal decreases, and the PLL circuit 1 is locked in a state where a phase of the reference clock signal Fr is ahead of a phase of the frequency division signal Fn and in a state where a band is offset from a dead band and linearity of the output current is favorable.

The phase difference output cycle will be described.

Figures 3A, 3B, 3C:
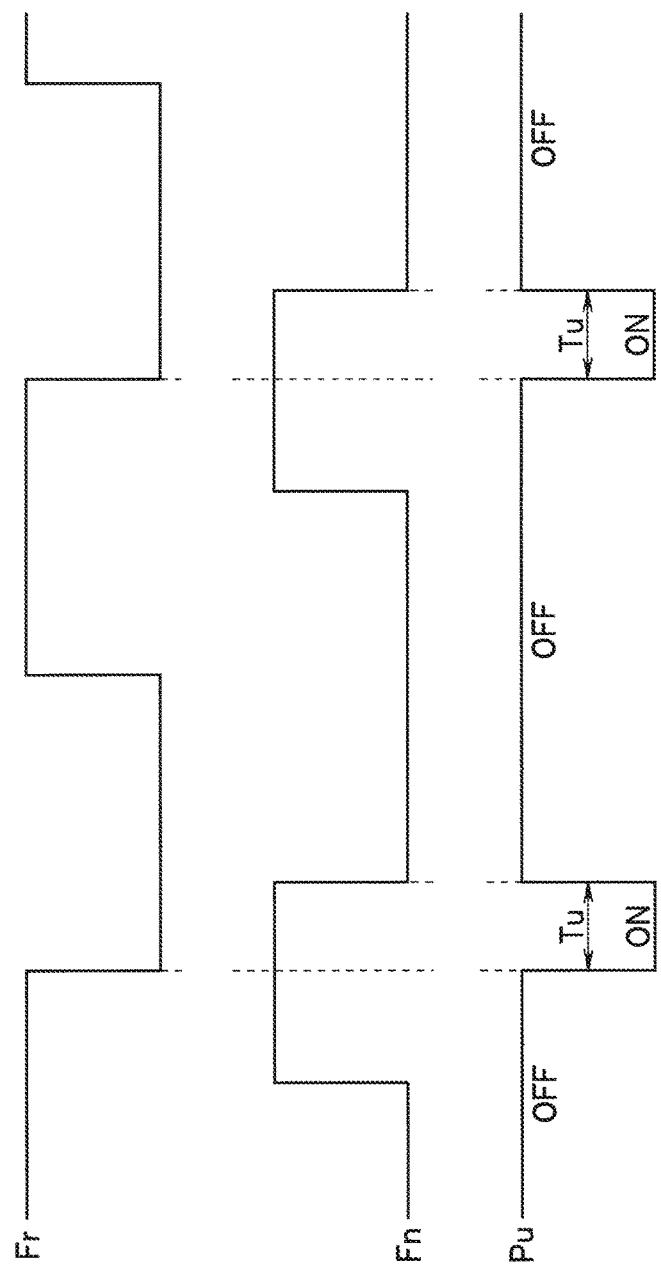
FIG. 3A is a waveform diagram illustrating a waveform of a reference clock signal Fr of the PLL circuit according to the embodiment.
FIG. 3B is a waveform diagram illustrating a waveform of a frequency division signal Fn of the PLL circuit according to the embodiment.
FIG. 3C is a waveform diagram illustrating a waveform of a phase difference signal Pu of the PLL circuit according to the embodiment.

FIG. 3A to FIG. 4C are waveform diagrams illustrating waveforms of the PLL circuit 1 according to the embodiment. FIG. 3A and FIG. 4A illustrate waveforms of the reference clock signal Fr, FIG. 3B and FIG. 4B illustrate waveforms of the frequency division signal Fn, FIG. 3C illustrates a waveform of the phase difference signal Pu, and FIG. 4C illustrates a waveform of the phase difference signal Pd. In the phase difference output cycle, a current I1 in accordance with a phase difference between the reference clock signal Fr and the frequency division signal Fn is output to the loop filter 6.

The driver Dv outputs a drive signal and puts the discharges switches Sd1 and Sd2 and the charge switches Sc1 and Sc2 into a disconnection state.

The driver Dv outputs a drive signal and connects the output terminal D2 and the GND by the ground switch Sg to set the output terminal D2 as ground potential. That is, the ground switch Sg connects the output terminal D2 and the GND before the capacitor 22 is connected to the discharge path.

The phase comparator 4 compares a pulse of the reference clock signal Fr and a pulse of the frequency division signal Fn and outputs the phase difference signals Pu and Pd to the charge pump circuit 5.

For example, as illustrated in FIG. 3A to FIG. 3C, the phase comparator 4 puts the phase difference signal Pu into an ON state for a time period corresponding to a phase shift amount when a phase of the frequency division signal Fn lags behind a phase of the reference clock signal Fr. Specifically, during a time period Tu from falling of the reference clock signal Fr until falling of the frequency division signal Fn, the phase difference signal Pu is put into an ON state, and the drive switch Sw1 connects the output terminal D1 and the charge pump output terminal Cout.

On the other hand, as illustrated in FIG. 4A to FIG. 4C, the phase comparator 4 puts the phase difference signal Pd into an ON state during a time period corresponding to a phase shift amount when the phase of the frequency division signal Fn is ahead of the phase of the reference clock signal Fr. Specifically, during a time period Td from falling of the frequency division signal Fn until falling of the reference clock signal Fr, the phase difference signal Pd is put into an ON state, and the drive switch Sw2 connects the GND and the charge pump output terminal Cout via the transistor T3.

When the reference current Iref is input to the transistor T1 from the constant current source 12, in the current mirror C1, a voltage between the gate and the source of each of the transistors T1, T2 and T3 becomes the same, and a current Id obtained by mirroring the reference current Iref flows in the drain of the transistor T2. The current Id also flows in the drain of the transistor T4 connected to the drain of the transistor T2.

Figure 5:
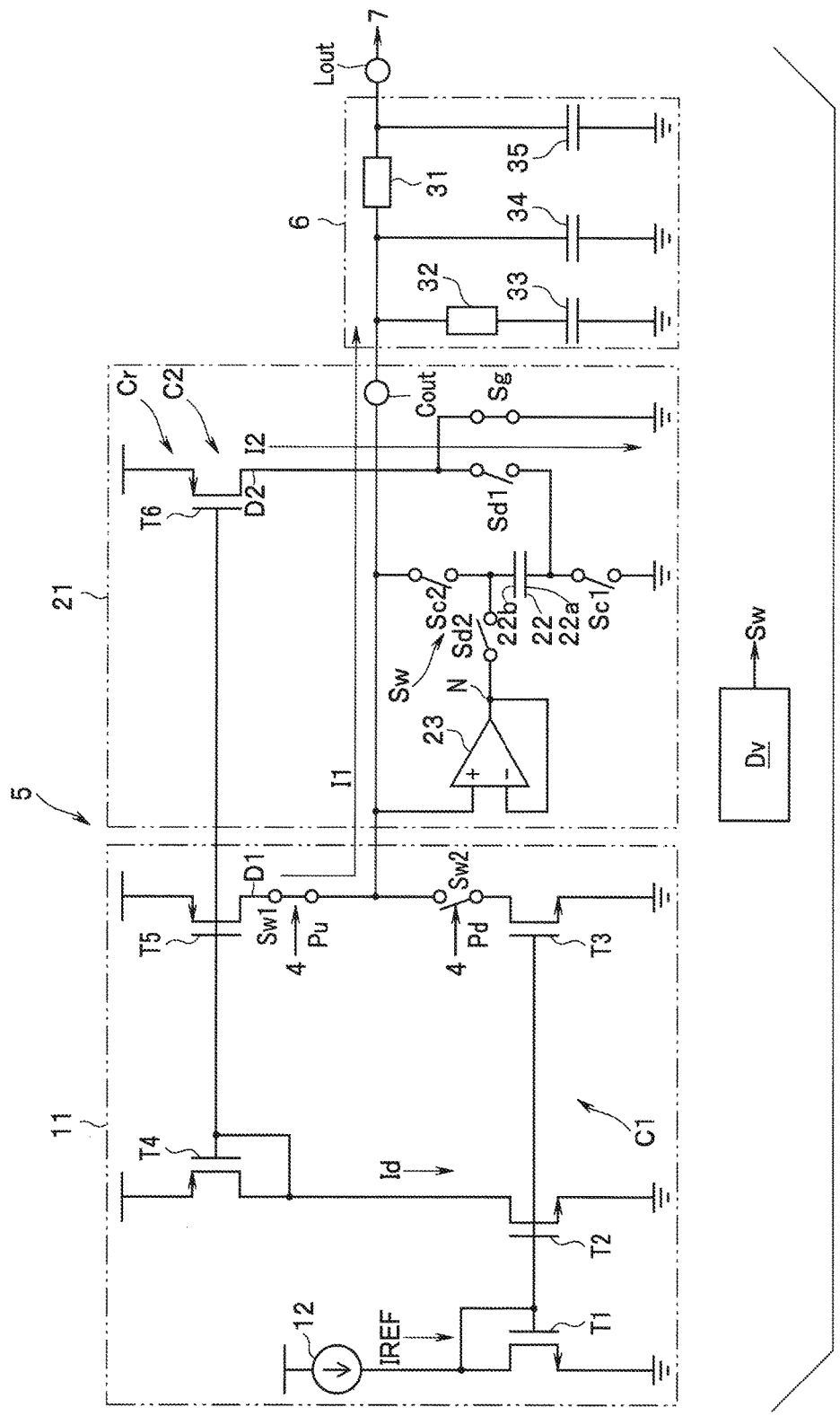
FIG. 5 is an explanatory diagram for explaining an example of a phase difference output cycle of the charge pump circuit of the PLL circuit according to the embodiment.

FIG. 5 is an explanatory diagram for explaining an example of the phase difference output cycle of the charge pump circuit 5 of the PLL circuit 1 according to the embodiment.

As illustrated in FIG. 5, when the phase difference signal Pu is put into an ON state, the drive switch Sw1 connects the output terminal D1 and the charge pump output terminal Cout. In the output terminal D1, a current I1 flows so as to compensate for electric charges discharged from the loop filter 6. Therefore, a pulse width of the current I1 in accordance with a time period of a connection state of the drive switch Sw1 becomes larger in accordance with leading of the charge current Ic from the loop filter 6. The current I1 is output to the loop filter 6 via the charge pump output terminal Cout. The electric charges of the current I1 are charged to the capacitors 33, 34 and 35. That is, the pulse width of the current I1 is made larger by leading of the charge current Ic so as to prevent linearity from deteriorating as a result of a response of the current I1 being too late.

The discharge cycle will be described next.

Figure 6:
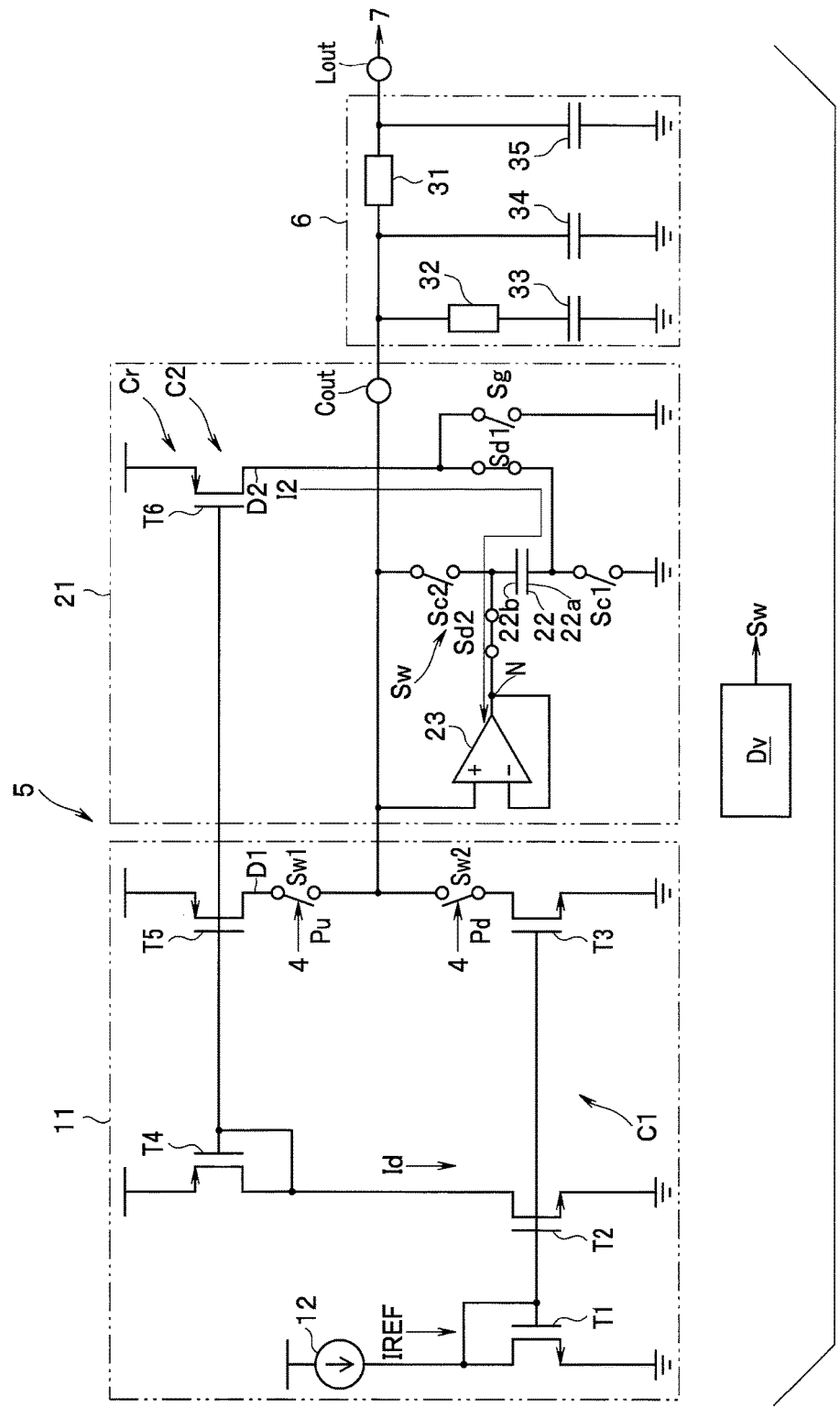
FIG. 6 is an explanatory diagram for explaining an example of a discharge cycle of the charge pump circuit of the PLL circuit according to the embodiment.

FIG. 6 is an explanatory diagram for explaining an example of the discharge cycle of the charge pump circuit 5 of the PLL circuit 1 according to the embodiment.

In the discharge cycle, after the current I1 is output to the loop filter 6 via the charge pump output terminal Cout, electric charges of the capacitor 22 are discharged by the current I2 output from the output terminal D2.

As illustrated in FIG. 6, the driver Dv outputs a drive signal, puts the discharge switches Sd1 and Sd2 into a connection state, puts the charge switches Sc1 and Sc2 into a disconnection state, and connects the capacitor 22 to the discharge path.

The current I2 output from the output terminal D2 flows in the amplifier 23 via the capacitor 22 and causes the electric charges of the capacitor 22 to be discharged. The electric charges discharged from the capacitor 22 flow into the amplifier 23, and inflow to parasitic capacitance is suppressed.

The first end 22a of the capacitor 22 is switched to the output terminal D2 which is made the ground potential from the GND. The second end 22b of the capacitor 22 is switched to the amplifier output terminal from the charge pump output terminal Cout. Therefore, potential of the first end 22a and the second end 22b of the capacitor 22 does not change even if a cycle is switched from the charge cycle to the discharge cycle, so that inflow of electric charges to the parasitic capacitance is suppressed.

The charge cycle will be described next.

Figure 7:
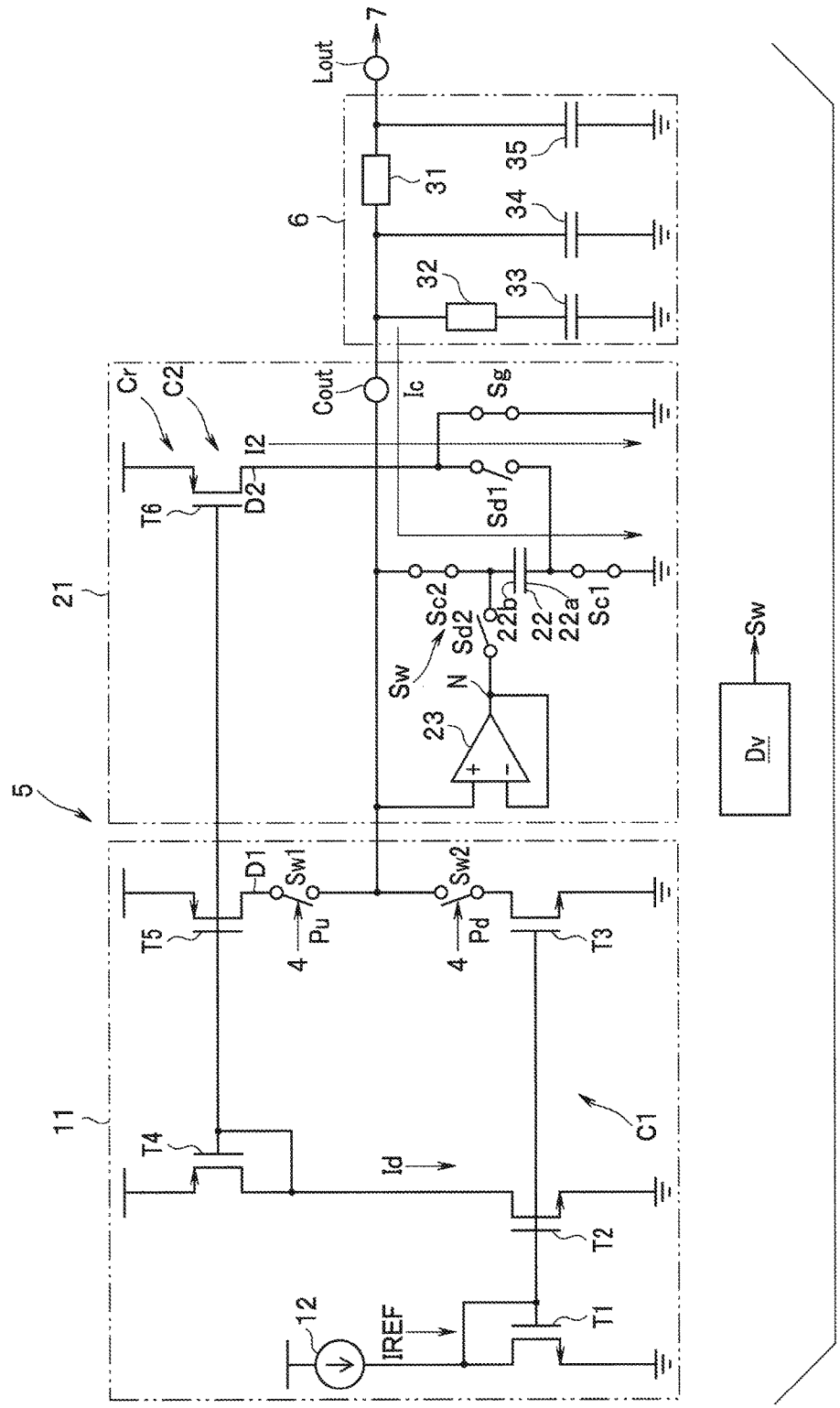
FIG. 7 is an explanatory diagram for explaining an example of a charge cycle of the charge pump circuit of the PLL circuit according to the embodiment.

FIG. 7 is an explanatory diagram for explaining an example of the charge cycle of the charge pump circuit 5 of the PLL circuit 1 according to the embodiment.

In the charge cycle, after the electric charges of the capacitor 22 are discharged, electric charges are charged by the charge current Ic input from the loop filter 6 via the charge pump output terminal Cout.

As illustrated in FIG. 7, the driver Dv outputs a drive signal, puts the discharge switches Sd1 and Sd2 into a disconnection state, puts the charge switches Sc1 and Sc2 into a connection state and connects the capacitor 22 to the charge path.

The charge current Ic flows in the GND via the capacitor 22. The capacitor 22 is charged by the charge current Ic.

The driver Dv may output a drive signal and connect the output terminal D2 and the GND with the ground switch Sg to prepare for the charge cycle.

That is, the current I1 is output to the charge pump output terminal Cout from the output terminal D1 through driving of the drive switch Sw1, and after the current I1 is output, the capacitor 22 is connected to the discharge path through driving of the switch circuit Sw, electric charges are discharged by the current I2 output from the output terminal D2, and after the electric charges are discharged, the capacitor 22 is connected to the charge path through driving of the switch circuit Sw, and charged by the charge current Ic input from the charge pump output terminal Cout.

Figure 8:
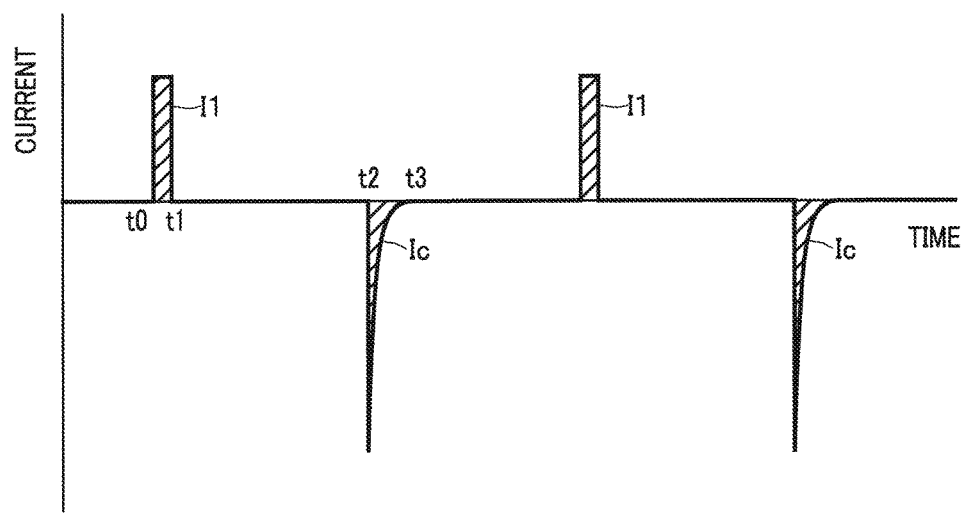
FIG. 8 is a graph explaining an example of relationship between an output current flowing in a charge pump output terminal of the charge pump circuit and time according to the embodiment.

FIG. 8 is a graph explaining an example of relationship between an output current flowing in the charge pump output terminal Cout of the charge pump circuit 5 and time according to the embodiment.

As illustrated in FIG. 8, a period between time t0 and t1 is the phase difference output cycle. In the phase difference output cycle, the current I1 is output to the loop filter 6.

A period between time t1 and t2 is the discharge cycle. In the discharge cycle, there is no change in the output current at the charge pump output terminal Cout. At the capacitor 22, electric charges are discharged by the current I2 obtained by mirroring the current Id.

A period between time t2 and t3 is the charge cycle. In the charge cycle, electric charges of the capacitor 22 are charged by the charge current Ic input from the charge pump output terminal Cout.

An average of the current I1 is the same as an average of the charge current Ic. Further, the average of the charge current Ic is also the same as an average of the discharge current.

The current I2 is output while mirroring the reference current Iref in a similar manner to the current I1. Noise generated at the constant current source 12 and the transistors T1, T2 and T4 is superimposed on each of the current I1 and the current I2. By discharging being performed by the current I2 and charging being performed by the current I1, the noise superimposed on the currents I1 and I2 is cancelled out from each other.

By this means, at the charge pump circuit 5, it is possible to cancel out noise of the transistors T1 and T2 which are the NMOS where flicker noise is large. Further, at the charge pump circuit 5, the drive switch Sw2 is rarely put into an ON state after the PLL circuit is locked compared to the drive switch Sw1, so that generation of noise of the transistor T3 which is the NMOS can be also suppressed. Further, at the charge pump circuit 5, inflow of electric charges to parasitic capacitance when the cycle is switched from the charge cycle to the discharge cycle can be suppressed, so that it is possible to more reliably cancel out noise.

At the charge pump circuit 5, a size of the transistors T1, T2 and T4 where noise is cancelled out is made smaller, and power is saved, and a size of the transistors T5 and T6 where noise is not cancelled out is also made smaller. If the size of the transistor T5 is made smaller, operation speed is made higher as a result of drain capacitance being reduced, and the pulse width of the current I1 can be made smaller, so that noise and spurious of the clock are reduced. That is, at the charge pump circuit 5, it is possible to suppress noise of the transistors T2 and T4 without making the size of the transistors T2 and T4 larger.

According to the embodiment, it is possible to suppress generation of noise at the charge pump circuit 5 and the PLL circuit 1 and realize a further smaller size.

Note that, while, in the embodiment, the current mirror C1 is configured with an NMOS, and the current mirror C2 is configured with a PMOS, the current mirror C1 may be configured with a PMOS, and the current mirror C2 may be configured with an NMOS.

Note that, while, in the embodiment, the amplifier 23 is provided, and the amplifier output terminal is connected to the node N, in place of the amplifier 23, the power supply having a predetermined voltage may be connected to the node N.

While the embodiment of the present invention has been described, this embodiment is provided as an example, and is not intended to limit the scope of the present invention. This new embodiment can be implemented in other various forms, and various omission, replacement and change can be made without departing from the gist of the invention. This embodiment and modifications are included in the scope and the gist of the invention and are also included in the scope of the invention recited in the claims and equivalence of the invention.

What is claimed is:

1. A charge pump circuit comprising:
a current mirror circuit configured to cause a current obtained by mirroring a reference current to flow to a first output terminal and a second output terminal;
a first drive switch configured to connect or disconnect the first output terminal and a charge pump output terminal;
a capacitor; and
a switch circuit configured to connect the capacitor either to a discharge path between the second output terminal and a node which provides a predetermined voltage or to a charge path between the charge pump output terminal and a GND.

2. The charge pump circuit according to claim 1,
wherein the switch circuit includes a discharge switch and a charge switch,
the discharge switch connects or disconnects a first end of the capacitor and the second output terminal, and a second end of the capacitor and the node,
the charge switch connects or disconnects the first end and the GND, and the second end and the charge pump output terminal,
when the discharge switch is put into a connection state, and the charge switch is put into a disconnection state, the capacitor is connected to the discharge path, and
when the discharge switch is put into a disconnection state, and the charge switch is put into a connection state, the capacitor is connected to the charge path.

3. The charge pump circuit according to claim 1, further comprising:
an amplifier,
wherein the amplifier provides the node with a voltage substantially equal to a voltage of the charge pump output terminal.

4. The charge pump circuit according to claim 1, further comprising:
a ground switch,
wherein the ground switch connects or disconnects the second output terminal and the GND.

5. The charge pump circuit according to claim 4,
wherein the ground switch connects the second output terminal and the GND before the capacitor is connected to the discharge path, and disconnects the second output terminal and the GND when the capacitor is connected to the discharge path.

6. The charge pump circuit according to claim 1,
wherein the current is output from the first output terminal to the charge pump output terminal through driving of the first drive switch, and after the current is output, the capacitor is connected to the discharge path through driving of the switch circuit, and electric charges are discharged by the current output from the second output terminal, and after the electric charges are discharged, the capacitor is connected to the charge path through driving of the switch circuit, and charging is performed by a charge current input from the charge pump output terminal.

7. The charge pump circuit according to claim 1,
wherein the current mirror circuit includes a first current mirror and a second current mirror,
the first current mirror and the second current mirror are connected to each other,
the first current mirror is configured with an NMOS and is connected to the reference current, and
the second current mirror is configured with a PMOS and includes the first output terminal and the second output terminal.

8. The charge pump circuit according to claim 7,
wherein the first current mirror includes a first transistor, a second transistor and a third transistor, first gates of which are connected to one another,
the second current mirror includes a fourth transistor, a fifth transistor and a sixth transistor, second gates of which are connected to one another,
a drain of the first transistor is connected to the first gate and the reference current,
respective drains of the second transistor and the fourth transistor are connected to each other,
the third transistor has a source connected to the GND and a drain connected to a second drive switch,
the second drive switch connects or disconnects the GND and the charge pump output terminal via the third transistor,
the fifth transistor includes the first output terminal, and the sixth transistor includes the second output terminal.

9. The charge pump circuit according to claim 1, further comprising:
a driver,
wherein the driver drives the switch circuit.

10. A PLL circuit comprising:
a charge pump circuit which includes:
a current mirror circuit configured to cause a current obtained by mirroring a reference current to flow to a first output terminal and a second output terminal;
a first drive switch configured to connect or disconnect the first output terminal and a charge pump output terminal;
a capacitor; and
a switch circuit configured to connect the capacitor either to a discharge path between the second output terminal and a node which provides a predetermined voltage or to a charge path between the charge pump output terminal and a GND; and
a phase comparator and a loop filter connected to the charge pump circuit;
a VCO connected to the loop filter; and
a frequency divider connected to the VCO and the phase comparator.

* * * * *